(12) United States Patent
Henry et al.

(10) Patent No.: US 8,575,953 B2
(45) Date of Patent: Nov. 5, 2013

(54) INTERCONNECT SYSTEM

(75) Inventors: David W. Henry, Platte Citty, MO (US); Kiley Beard, Kearney, MO (US); William Thurston, Kansas City, MO (US); Jason W. Farris, Overland Park, KS (US); Bradley Smith, Mission, KS (US)

(73) Assignee: Interconnect Devices, Inc., Kansas City, KS (US)

( * ) Notice: Subject to any disclaimer, the term of this patent is extended or adjusted under 35 U.S.C. 154(b) by 245 days.

(21) Appl. No.: 13/225,141

(22) Filed: Sep. 2, 2011

(65) Prior Publication Data

US 2011/0312229 A1    Dec. 22, 2011

Related U.S. Application Data

(63) Continuation of application No. 12/434,423, filed on May 1, 2009, now abandoned.

(60) Provisional application No. 61/049,579, filed on May 1, 2008.

(51) Int. Cl.
*G01R 31/00* (2006.01)

(52) U.S. Cl.
USPC ............ 324/754.11; 324/755.05; 324/755.08; 324/756.05

(58) Field of Classification Search
None
See application file for complete search history.

(56) References Cited

U.S. PATENT DOCUMENTS

| | | |
|---|---|---|
| 4,793,814 A | 12/1988 | Zifcak et al. |
| 5,096,426 A | 3/1992 | Simpson et al. |
| 5,360,348 A | 11/1994 | Johnson |
| 5,388,996 A * | 2/1995 | Johnson ..................... 439/65 |
| 5,749,738 A | 5/1998 | Johnson et al. |
| 5,899,755 A | 5/1999 | Kline |
| 5,938,451 A | 8/1999 | Rathburn |
| 5,947,749 A | 9/1999 | Rathburn |
| 6,154,040 A | 11/2000 | Tsukamoto et al. |
| 6,203,329 B1 | 3/2001 | Johnson et al. |
| 6,244,874 B1 | 6/2001 | Tan |
| 6,297,653 B1 | 10/2001 | Hembree |
| 6,529,025 B1 | 3/2003 | Kline |
| 6,561,819 B1 | 5/2003 | Huang et al. |
| 6,854,981 B2 | 2/2005 | Nelson |
| 7,059,866 B2 | 6/2006 | Gilk |
| 7,202,686 B2 | 4/2007 | Sakiyama |
| 7,303,404 B2 | 12/2007 | Osato et al. |
| 7,338,293 B2 | 3/2008 | Gilk |
| 7,381,060 B2 | 6/2008 | Ju |
| 7,445,465 B2 | 11/2008 | Lopez et al. |
| 7,619,425 B2 | 11/2009 | Kimura |
| 7,625,219 B2 | 12/2009 | Osato et al. |
| 7,639,026 B2 | 12/2009 | Shell et al. |
| 7,737,708 B2 | 6/2010 | Sherry |
| 2002/0003424 A1 | 1/2002 | Johnson |
| 2003/0224663 A1 | 12/2003 | Johnson et al. |
| 2006/0216962 A1 | 9/2006 | Gilk |

FOREIGN PATENT DOCUMENTS

| | | |
|---|---|---|
| WO | WO 2006085388 A1 | 8/2006 |
| WO | WO 2006114895 A1 | 11/2006 |

* cited by examiner

*Primary Examiner* — Minh N Tang
(74) *Attorney, Agent, or Firm* — Finnegan, Henderson, Farabow, Garrett & Dunner LLP

(57) ABSTRACT

A test contact may include a first portion having an open-ended rounded shape. The first portion may define an opening therethrough. The test contact may include a second portion having a curved structure. The first portion and the second portion may be formed integrally, and the second portion may be configured to contact a portion of a device lead.

18 Claims, 10 Drawing Sheets

INTERCONNECT SYSTEM

This application is a continuation of U.S. patent application Ser. No. 12/434,423, filed May 1, 2009, now abandoned, the entire contents of which are herein incorporated by reference; this application further claims priority to U.S. Patent Application No. 61/049,579, filed May 1, 2008.

BACKGROUND

Test sockets and contactors for effecting interconnection between conductors exist and are known in the art. However, current interconnect systems, including those that utilized spring probe technology, may not maintain adequate electrical contact between a contact and a Quad, flat, no-lead package ("QFN"), a MicroLeadFrame package ("MLF"), a Thin Small Outline Package ("TSOP") and/or other similar devices.

SUMMARY

Before the present methods are described, it is to be understood that this invention is not limited to the particular systems methodologies or protocols described, as these may vary. It is also to be understood that the terminology used herein is for the purpose of describing particular embodiments only, and is not intended to limit the scope of the present disclosure which will be limited only by the appended claims.

It must be noted that as used herein and in the appended claims, the singular forms "a," "an," and "the" include plural reference unless the context clearly dictates otherwise. Unless defined otherwise, all technical and scientific terms used herein have the same meanings as commonly understood by one of ordinary skill in the art. As used herein, the term "comprising" means "including, but not limited to."

In an embodiment, a test contact may include a first portion having an open-ended rounded shape. The first portion may define an opening therethrough. The test contact may include a second portion having a curved structure. The first portion and the second portion may be formed integrally, and the second portion may be configured to contact a portion of a device lead.

In an embodiment, an interconnect system may include a testing board, a device under test, one or more elastomer elements and one or more contacts. Each contact may include a first portion having an open-ended rounded shape. The first portion may define an opening therethrough, and the opening may be configured to surround one of the elastomer elements. Each contact may include a second portion having a curved structure. Each contact may be configured to provide an electrical interconnection between the testing board and the device under test. The second portion of each contact may be configured to remove contaminants from a portion of a lead of the device under test.

BRIEF DESCRIPTION OF THE DRAWINGS

Aspects, features, benefits and advantages of the present invention will be apparent with regard to the following description and accompanying drawings, of which.

DETAILED DESCRIPTION

Figure 1A:
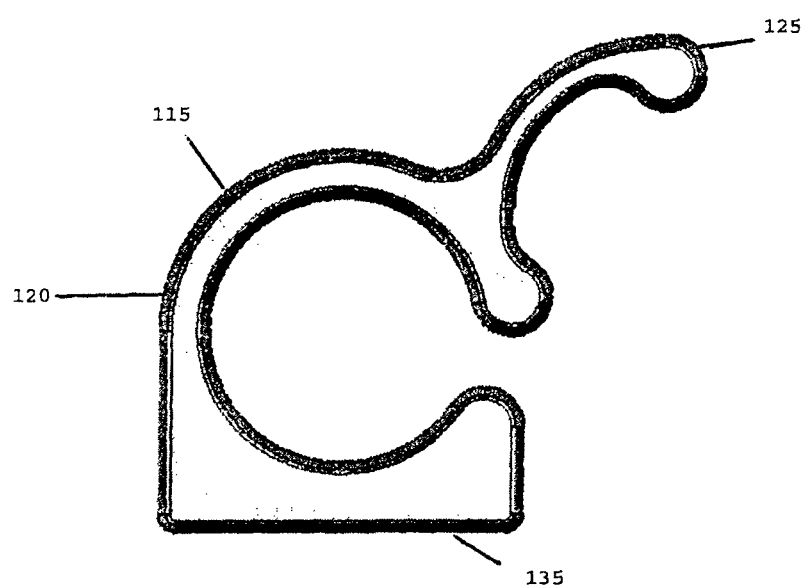
FIGS. 1A and 1B illustrate an exemplary contact according to an embodiment.

FIG. 1A illustrates an exemplary contact according to an embodiment. In an embodiment, an interconnect system may include one or more contacts 115. The one or more contacts 115 may be removable from the interconnect system. In an embodiment, a contact 115 may provide an electrical interconnection between a testing board, such as a circuit board, and a device under test ("DUT"). A contact 115 may be fabricated from a conductive material and/or a combination of conductive materials. For example, a contact 115 may be fabricated from a conductive material such as beryllium copper or other metal. In an embodiment, a contact 115 may be plated to provide resistance to intermetallic contamination in lead-free device testing.

As illustrated by FIG. 1A, a contact 115 may have a first portion 120 and a second portion 125. The first portion 120 may have an open-ended rounded shape that may define an opening therethrough. For example, as illustrated by FIG. 1A, the first portion 120 may have a ring-like structure. In an embodiment, the first portion 120 may be integrally foil led with the second portion 125.

In an embodiment, the opening defined by a contact 115 may be of a sufficient size to surround an elastomer element 130. The elastomer element 130 may be configured to be stretched and compressed without being permanently deformed. In an embodiment, the elastomer element 130 may be fabricated from plastic, thermoplastic, resin and/or the like.

Figure 1B:
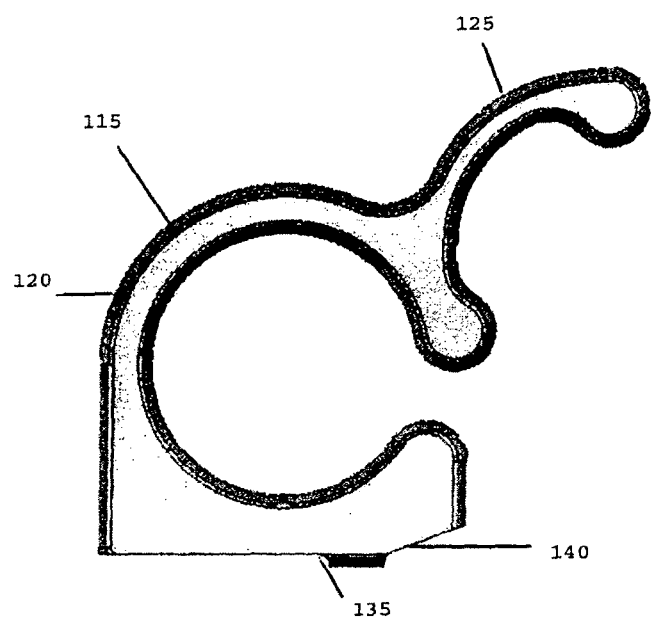

In an embodiment, the second portion 125 of a contact 115 may have a curved structure. In an embodiment, a base portion 135 of a contact may have an angled portion 140 as illustrated by FIG. 1B. The base portion may also be connected to a protrusion 145 as illustrated by FIG. 1B. The angled portion 140 and/or the protrusion 145 may facilitate contact with one or more DUT boards.

Figure 1C:
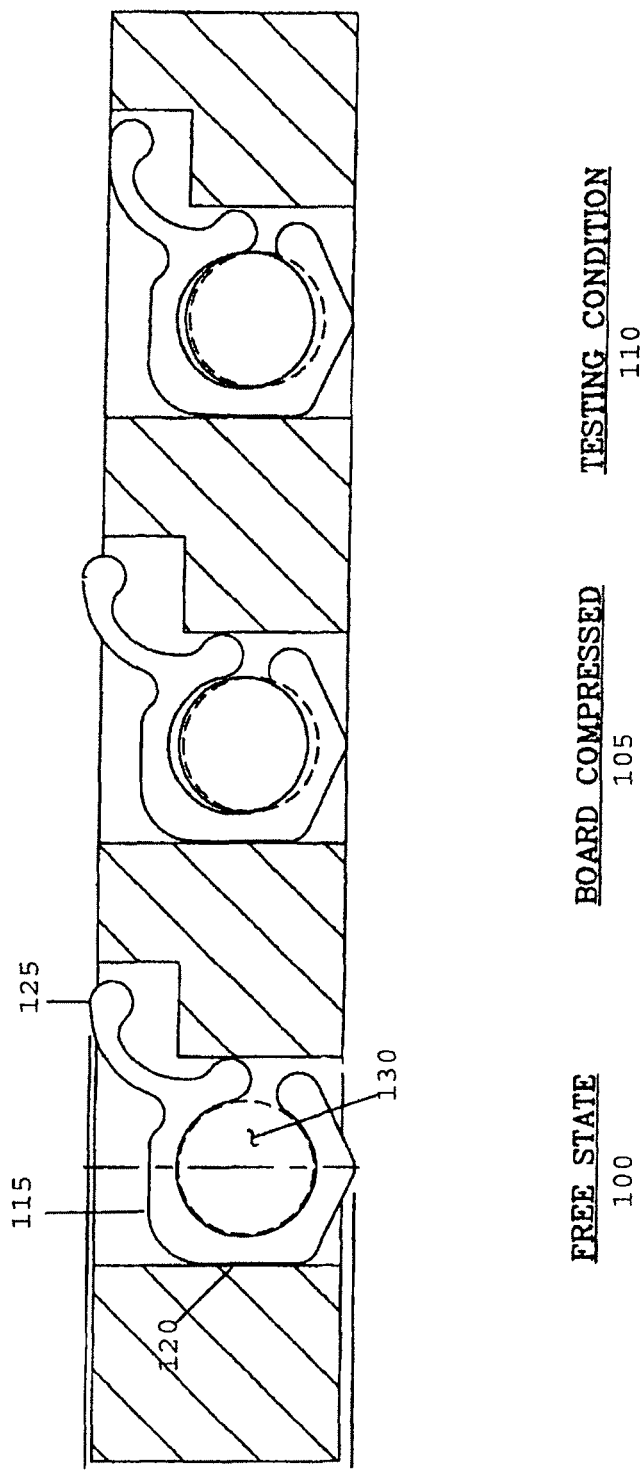
FIG. 1C illustrates a portion of a cross-sectional view of an exemplary interconnect system according to an embodiment.

FIG. 1C illustrates a portion of a cross-sectional view of an exemplary interconnect system in a free state 100, a board compressed state 105 and during testing 110. In an embodiment, the position of the second portion 125 relative to the board may change depending on the current state. For example, during a board compressed state 105, at least a portion of the second portion 125 may extend beyond an edge of the interconnect system. In a testing state 110, however, the second portion 125 may be substantially contained within the interconnect system. In an embodiment, during a testing state 110, at least a portion of the second portion 125 of the contact 115 may wipe against a portion of a device lead so that any debris, tin oxides or other contaminants may be removed from the lead and/or the contact surface. Removal of debris, tin oxides or other contaminants from the lead and/or the contact surface may help the contact maintain a low and consistent resistance which may result in extended yields. It may also help provide a secure and stable connection between the DUT and the circuit board.

Figure 2:
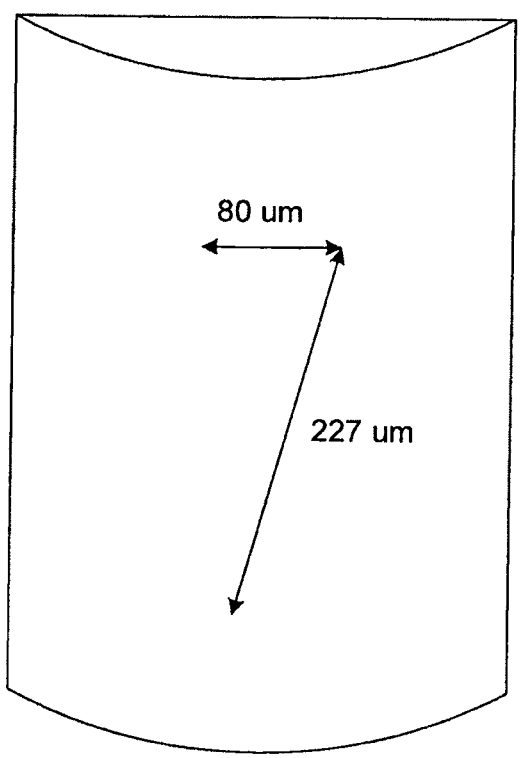
FIG. 2 illustrates exemplary witness marks produced by a contact described herein in comparison to those produced by another contact.

FIG. 2 illustrates exemplary witness marks left by the contact described herein in according to an embodiment. As illustrated by FIG. 2, a witness mark 200 left by the contact may be relatively narrow. As such, the contact may be less likely to damage the lead surface.

Example 1

Force Deflection Testing

Figure 3:
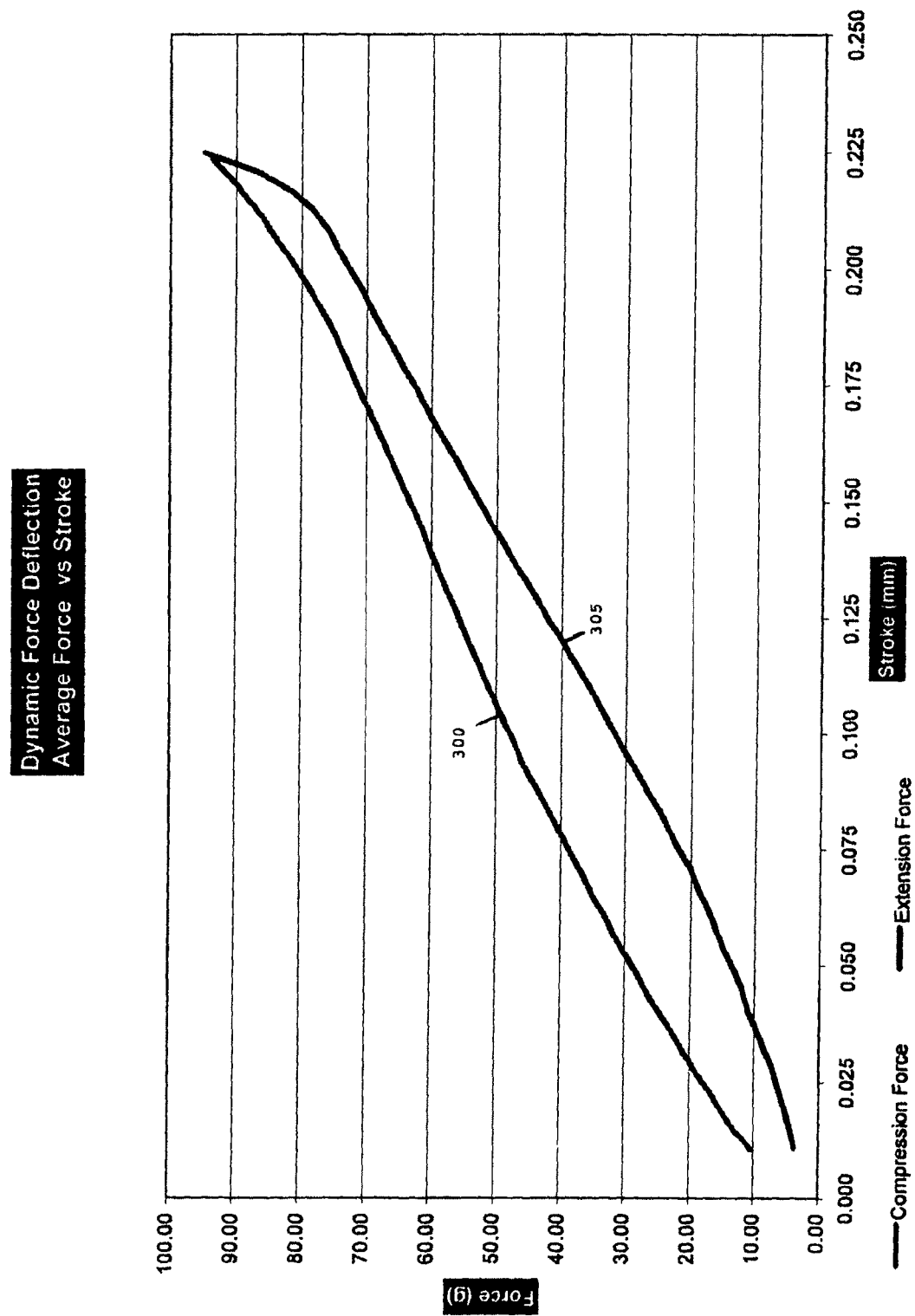
FIG. 3 illustrates a graph of exemplary contact compression according to an embodiment.

In an embodiment, a contact may have a compliance similar to that of a spring contact probe. During force deflection testing, a contact was placed in a fixture that allowed it to be compressed with a gold plated copper pad. A force gauge was used to measure the mechanical force during compression. In FIG. 3, the first line 300 represents the compression of the contact from its free state to a compression of 90 g of force. The second line 305 represents the extension of the contact from 90 g of force back to its free state. This process was repeated through five cycles and measured on ten separate contact samples. The results indicate that the contacts have a nominal travel value of approximately 0.006 inches on the DUT side and approximately 0.009 inches on a device side.

Example 2

High Current Testing

Figure 4:
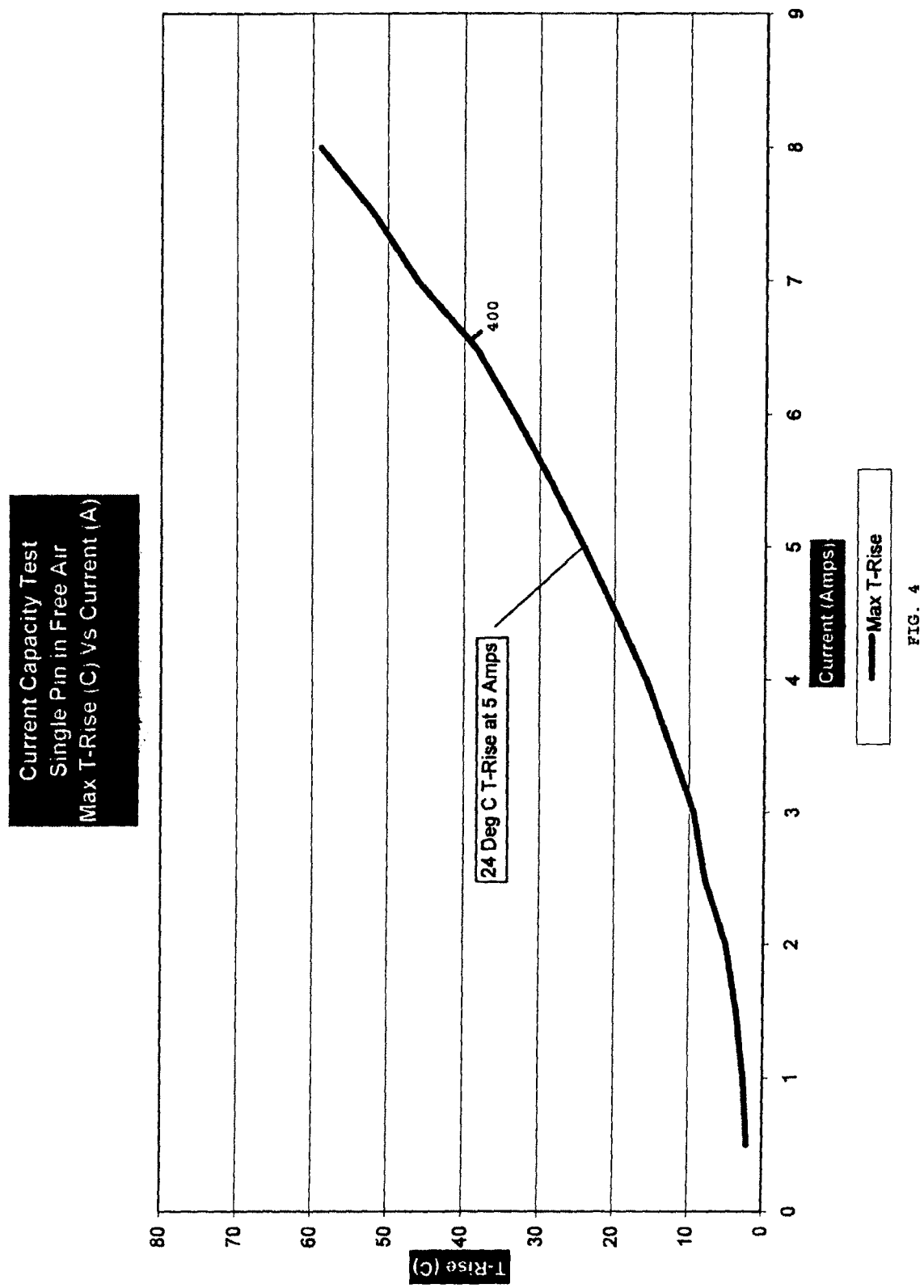
FIG. 4 illustrates a graph of exemplary temperature rise associated with a contact according to an embodiment.

High current testing measures the ability of a contact to resist a temperature rise over a period of time as current increases in a stepwise manner. During this test, electrical current was applied through a compressed contact via two gold plated copper pads. The temperature of the contact was measured versus the applied current, which was increased at 0.5 Amp increments from 0.5 Amps to 8 Amps with a five minute dwell time at each step. The test was conducted through a single contact, and the maximum temperature increase over the five contacts tested was 24° C. at 5 amps. The results are illustrated in FIG. 4. As illustrated by FIG. 4, the temperature rise 400 associated with a contact is less than 80° C. over a range of 5 Amps. As such, the contact is able to resist a significant temperature rise during use.

Example 3

Force Deflection Testing

Figure 5:
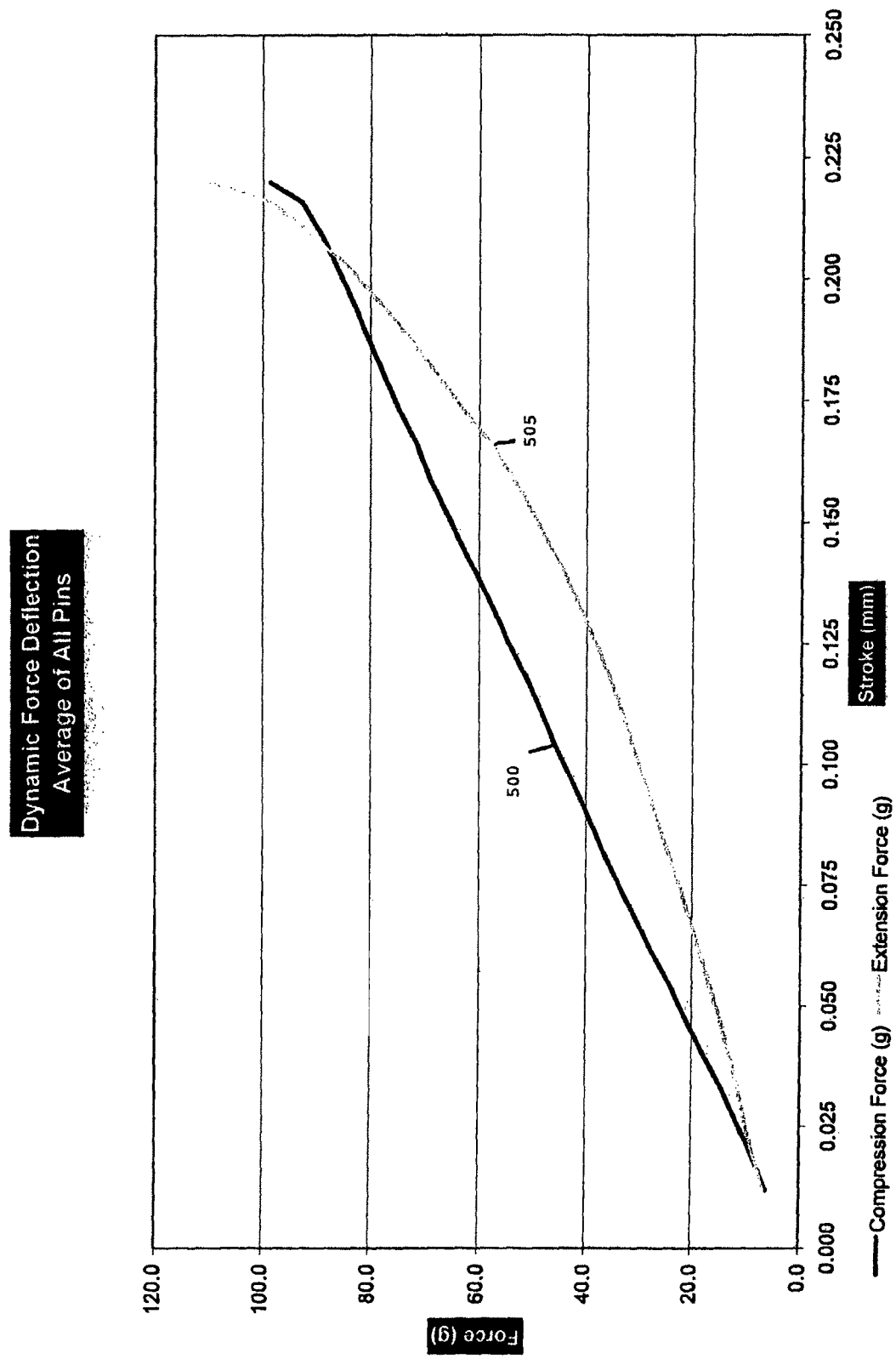
FIG. 5 illustrates a graph of exemplary contact strength according to an embodiment.

Upon completion of the high current testing, the contacts used in the initial force deflection test and the high current test were checked again for force versus deflection to ensure that the contacts' performance remained relatively consistent. As illustrated by FIG. 5, the compression force 500 and the extension force 505 of the contacts did not change significantly after the contacts had carried high current for an extended period of time. As such, the contact strength remained stable during and after high current testing.

Example 4

Environment and Life Testing

Figure 6:
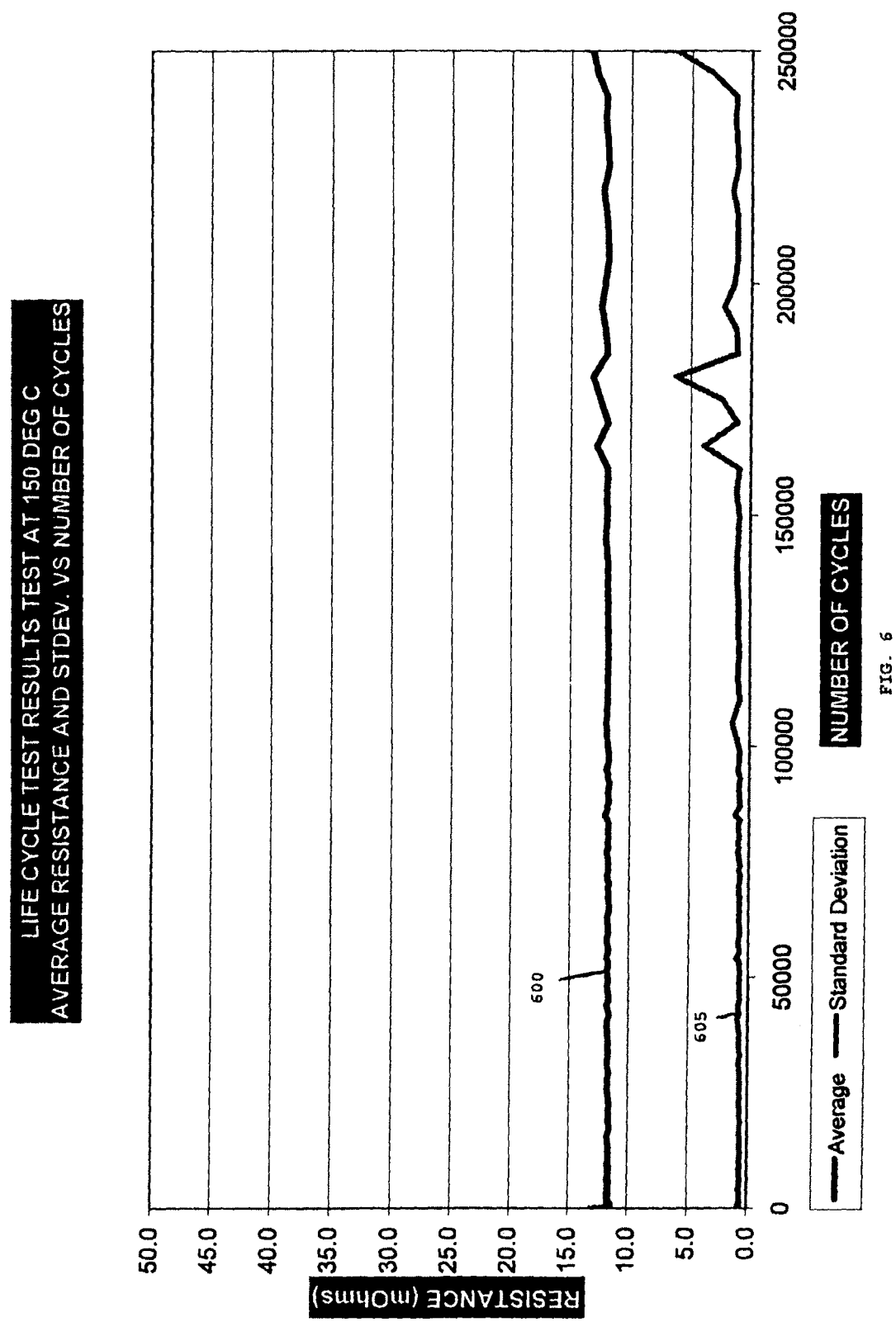
FIGS. 6 and 7 illustrate graphs of exemplary average pin resistance according to an embodiment.
Figure 7:
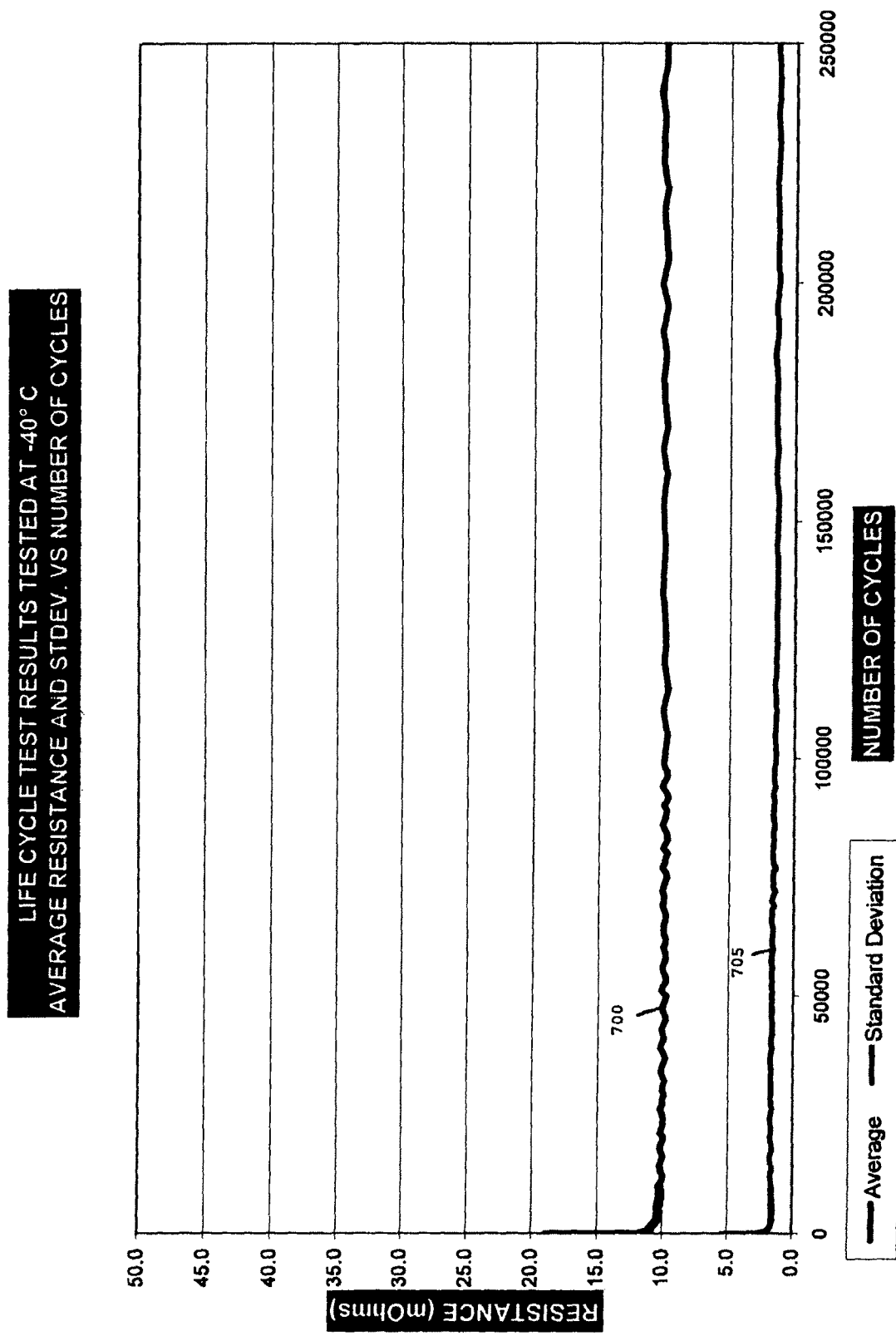

During a life cycle test, 30 contacts were tested at −40° C. and 150° C. over 250,000 cycles. The contacts were stroked to 0.23 mm against a gold plated copper pad at 0.025 amps and resistance measurements were taken at specified cycles. FIG. 6 illustrates the average pin resistance 600 and associated standard deviation 605 through 250,000 cycles at 150° C. FIG. 7 illustrates the average pin resistance 700 and associated standard deviation 705 through 250,000 cycles at −40° C. As illustrated by FIGS. 6 and 7, the average pin resistance was under 20 mΩ through 250,000 cycles for both 40° C. and 150° C. temperatures.

Example 5

Handler Simulation Testing

A handler test was designed to test resistance through specified cycles. A socket was designed with 48 contacts and tested against a daisy chain tin MLF. The resistance measured was through a pair of contacts at predefined resistance stops. The socket was tested through 20,000 cycles with 66 virgin device contacts. The results indicate that the average pin resistance is less than 50 mΩ through 20,000 cycles at 0.5 Amps in a socket.

Example 6

Durability Testing

Figure 8:
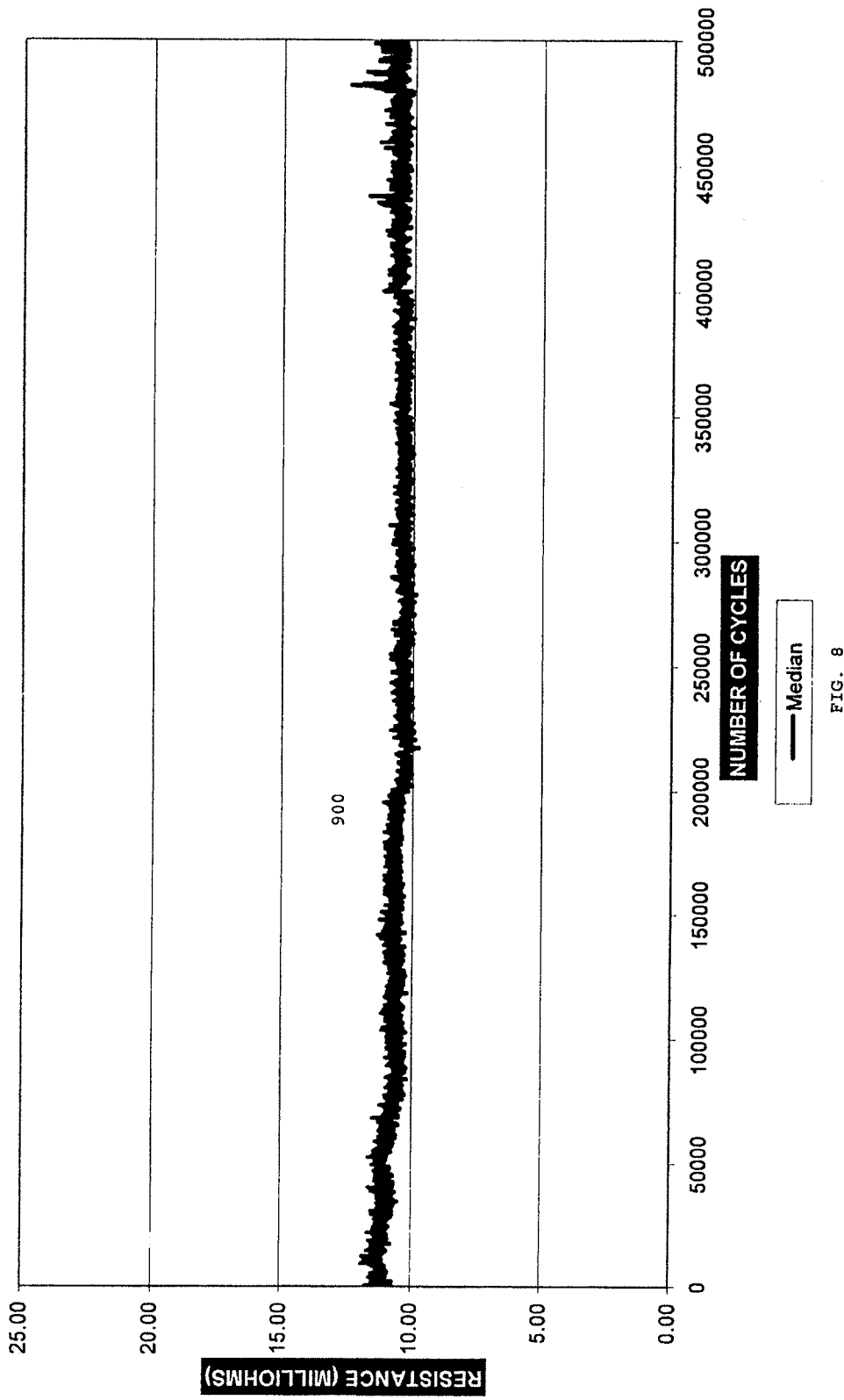
FIG. 8 illustrates a graph of exemplary median pin resistance according to an embodiment.

A handler simulation test was designed to test resistance through 500,000 cycles. Fifteen contacts were tested against a matte tin device simulator, and resistance was measured through each individual contact at predefined intervals. FIG. 8 illustrates that the median pin resistance 800 was less than 13 mΩ through 500,000 cycles. As such, the contact may be durable and reliable through hundreds of thousands of cycles with extremely low resistance.

It will be appreciated that various of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

What is claimed is:

1. A test contact comprising:
an open-ended rounded portion defining an aperture; and
a curved portion;
wherein the aperture is configured to accommodate at least a portion of an elastomer element therethrough such that the open-ended rounded portion substantially surrounds a closed outer perimeter of the portion of the elastomer element;
wherein the test contact and the elastomer element are configured to be accommodated in a socket structure,
wherein the socket structure further defines a first edge proximal to a portion of a first contact surface of the accommodated test contact and defines a second edge proximal to a portion of a second contact surface of the accommodated test contact;
wherein, in a first state, the portion of the first contact surface extends beyond the first edge by at least a first displacement amount and the portion of the first contact surface is separated from the portion of the second contact surface by at least a distance,
wherein, in a second state, the portion of the second contact surface extends beyond the second edge by a second displacement amount and the portion of the first contact surface is separated from the portion of the second contact surface by at least the distance, wherein, in a third state, the portion of the second contact surface is approximately at the second edge and the portion of the first contact surface is approximately at the first edge, and the portion of the first contact surface is separated from the portion of the second contact surface by at least the distance decreased by at least the second displacement amount;

wherein the portion of the elastomer element is configured to flexibly provide a first restoring force in response to a displacement of the portion of the first contact surface from its position in the first state towards an axis of the elastomer element by at least the first displacement amount, wherein the test contact is configured to flexibly provide a second restoring force in response to a compressive force between the portion of the first contact surface and the portion of the second contact surface from their positions in the second state, wherein the compressive force is capable of decreasing the distance by at least the second displacement amount; and wherein the second displacement amount is greater than the first displacement amount.

2. The test contact of claim 1,
wherein the open-ended rounded portion and the curved portion are formed integrally and terminate together in a common arm portion.

3. The test contact of claim 2,
wherein the second contact surface is substantially distal from the common arm portion.

4. The test contact of claim 1,
wherein the open-ended rounded portion comprises the portion of the first contact surface.

5. The test contact of claim 1,
wherein the curved portion comprises the portion of the second contact surface.

6. The test contact of claim 1,
wherein the open-ended rounded portion is substantially a "C" shape.

7. The test contact of claim 1,
wherein the curved portion is substantially an arc shape.

8. The test contact of claim 1,
wherein the open-ended rounded portion and the curved portion together lie substantially in a plane.

9. The test contact of claim 8,
wherein the axis of the elastomer element is substantially perpendicular to the plane.

10. The test contact of claim 9,
wherein the axis is an axis of symmetry of the closed outer perimeter.

11. The test contact of claim 8,
wherein the first edge and the second edge are substantially parallel in the plane, and the axis of the elastomer element lies between the first edge and the second edge.

12. The test contact of claim 1,
wherein the first edge and the second edge are substantially parallel.

13. The test contact of claim 1,
wherein, in the third state, the test contact is configured to provide an electrical interconnection between a testing board and a device under test.

14. The test contact of claim 1,
wherein the compressive force is configured to displace the portion of the second contact surface towards the portion of the first contact surface and to keep the portion of the first contact surface substantially fixed relative to the axis.

15. The test contact of claim 1,
wherein the open-ended rounded portion and the curved portion comprise beryllium copper.

16. The test contact of claim 1,
wherein the test contact has a compliance to the compressive force that is similar to a compliance of a spring-contact probe to the compressive force.

17. The test contact of claim 1,
wherein the second displacement amount is greater than 0.125 mm.

18. The test contact of claim 17,
wherein the compressive force is less than 120 grams-force.

* * * * *